United States Patent [19]

Maruyama et al.

[11] 4,199,777
[45] Apr. 22, 1980

[54] SEMICONDUCTOR DEVICE AND A METHOD OF MANUFACTURING THE SAME

[75] Inventors: Eiichi Maruyama, Kodaira; Hideaki Yamamoto, Hachioji, both of Japan

[73] Assignee: Hitachi, Ltd., Japan

[21] Appl. No.: 764,845

[22] Filed: Feb. 2, 1977

[30] Foreign Application Priority Data

Feb. 2, 1976 [JP] Japan .................................. 51/9381

[51] Int. Cl.² .......................................... H01L 29/06
[52] U.S. Cl. .......................................... 357/55; 357/49; 357/59; 357/68; 357/69; 357/71
[58] Field of Search ................. 357/71, 55, 49, 59, 357/68, 69

[56] References Cited

U.S. PATENT DOCUMENTS

| | | | |
|---|---|---|---|
| 3,699,407 | 10/1972 | Gurtler et al. | 357/55 |
| 3,754,161 | 8/1973 | Johnson | 357/59 |
| 3,761,782 | 9/1973 | Youmans | 357/55 |
| 3,858,237 | 12/1974 | Sawazaki et al. | 357/59 |
| 3,864,817 | 2/1975 | Lapham et al. | 357/59 |
| 4,001,859 | 1/1977 | Miyoshi et al. | 357/55 |

FOREIGN PATENT DOCUMENTS 2031444 6/1970 Fed. Rep. of Germany ............ 357/55
1165187 9/1969 United Kingdom ..................... 357/55

*Primary Examiner*—Edward J. Wojciechowicz
*Attorney, Agent, or Firm*—Craig and Antonelli

[57] ABSTRACT

A semiconductor device includes at least two different elements having different functions. At least one of the elements is fixed within a recess provided in a substrate, and wirings are provided on an insulating film deposited commonly on the elements and the substrate, so that there is no step or clearance between the elements or between the element and the substrate, making it possible to easily form good interconnections.

22 Claims, 25 Drawing Figures

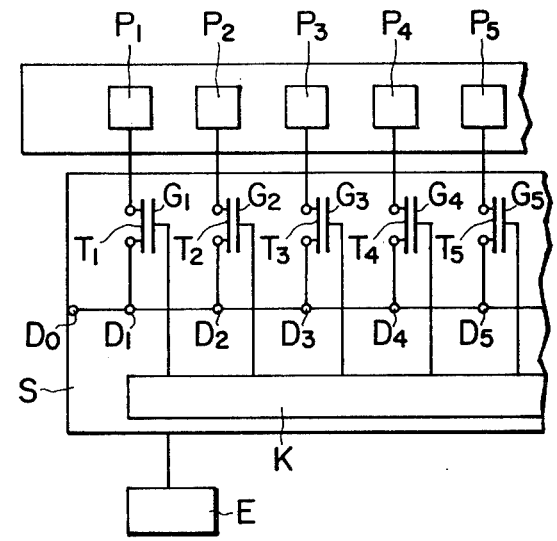
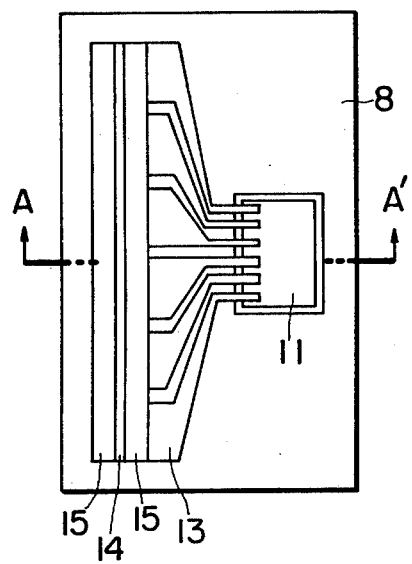
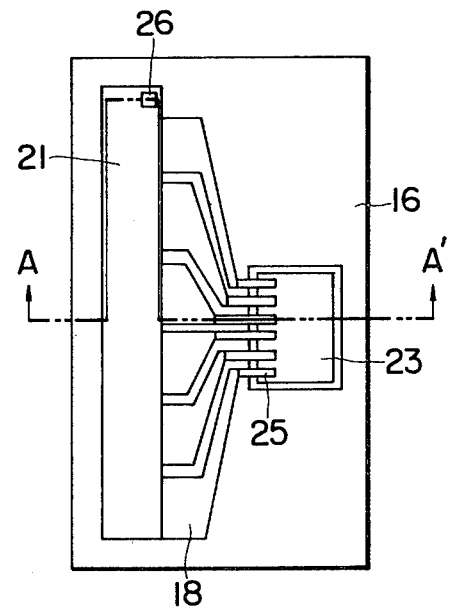
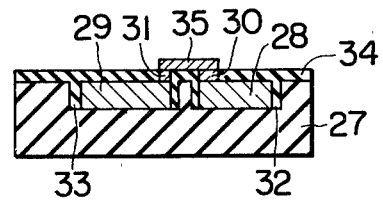

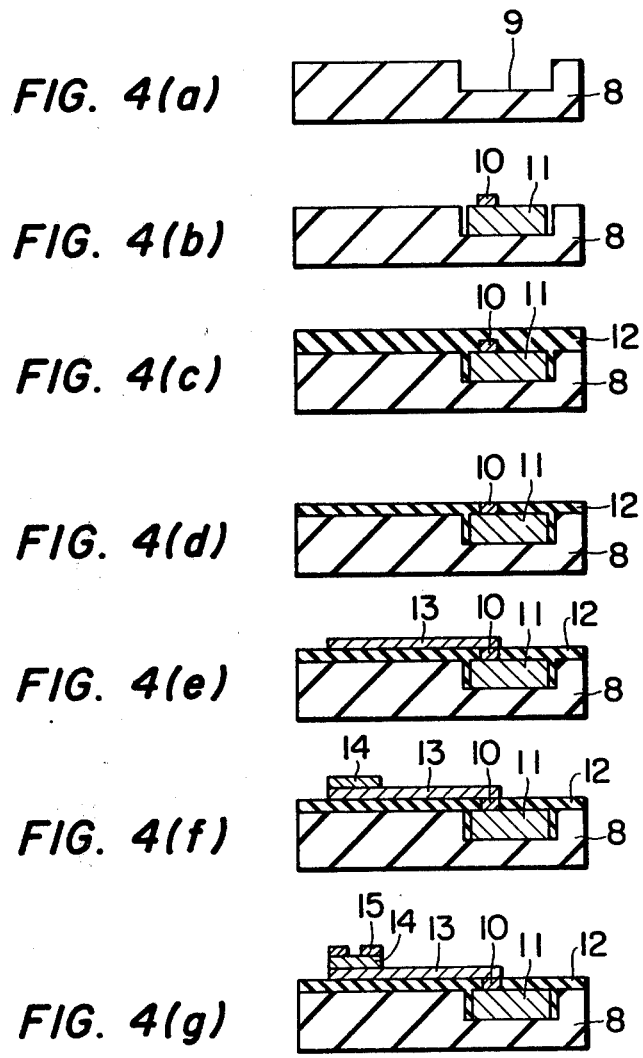

SEMICONDUCTOR DEVICE AND A METHOD OF MANUFACTURING THE SAME

BACKGROUND OF THE INVENTION

1. Field of the Invention

The invention relates to a semiconductor device in which a semiconductor element having a function such as switching, memory and amplification and another element, mainly one having a function such as photoelectric conversion, are electrically coupled into an integral form.

2. Description of the Prior Art

As is well known, silicon is extensively used as a material for the manufacture of transistors, ICs, LSIs, etc. Since, however, silicon has a forbidden gap of 1.1 eV and has an optical sensitive wavelength region in the near infrared region, it is unsuitable as a material for an element for receiving or emitting visible light.

As the material of an element for receiving or emitting visible light, accordingly, there has been employed a compound semiconductor material having a forbidden gap greater than that of silicon, for example, a group III–group V compound such as GaP or a group II–group VI compound such as CdS. For large-area uses, an amorphous semiconductor material such as Se is employed.

In order to form a solid state imaging device or a solid state display device by disposing the light receiving or emitting semiconductor elements as described above, in an array, a solid state element having a scanning function is required. With present-day technology, however, it is very difficult to form the solid state scanner by employing semiconductor material other than silicon. In general, therefore, a scanning circuit is constructed of a silicon element, and it is electrically connected by wirings with opto-electric or electro-optic transducers formed of a semiconductor material other than silicon. Thus, a solid state imaging device, as shown by way of example in FIG. 1, is formed.

FIG. 1 is a view for explaining the operation of an example of a solid state imaging device. A large number of MOS transistors $T_1, T_2, T_3, T_4, T_5 \ldots$ are formed in a silicon substrate S. Photoelectric transducers $P_1, P_2, P_3, P_4, P_5, \ldots$ are electrically connected to the source electrodes of the transistors, respectively.

On the substrate S, an integrated scanning circuit K (usually made up of a clock circuit for determining scanning synchronization and a shift register circuit for transferring pulses to the MOS transistors) is formed, by way of which a voltage from a power supply E is successively applied to the gate electrodes $G_1, G_2, G_3, G_4, G_5 \ldots$ of the respective transistors.

If, at this time, light is incident on the photoelectric transducers $P_1, P_2, P_3, P_4, P_5 \ldots$, light currents flow from the sources to the drains when a voltage is applied to the gates. Therefore, signals corresponding to the incident light can be successively derived from a common electrode $D_0$ which is coupled to the drain electrodes $D_1, D_2, D_3, D_4, D_5 \ldots$ of the respective transistors.

Where, in such a device, the number of transistors and photoelectric transducers is comparatively small, wirings between the corresponding transistors and photoelectric transducers may be sequentially connected one by one by the thermocompression bonding of metal wires. However, when the number of transistors and photoelectric transducers becomes large, it becomes difficult to carry out such an electrical connection.

It is, accordingly, desirable to affix silicon scanning circuit elements such as transistors and opto-electric or electro-optic transducers onto the same substrate and to form interconnections between the large number of elements at the same time by a photoetching process employing a photoresist.

In the prior-art device, however, a stepped portion exists ordinarily between the silicon element and the opto-electric (or electro-optic) element, between the substrate and the silicon element, between the substrate and the opto-electric (or electro-optic) element, or the like. This brings forth the problem that an interconnection to pass over such a stepped portion is not easilly formed or that when the interconnection is forcibly made, reliability is low due to its easy disconnection. It has therefore been extremely difficult to form practicable interconnections by photoetching.

SUMMARY OF THE INVENTION

An object of the invention is to solve the problems of the prior art and to provide, in a variety of devices such as a solid state imaging device and a solid stage display device wherein silicon elements and elements made of a material other than silicon are fixed and formed on an identical substrate, a semiconductor device having a structure in which the interconnections between the silicon elements and the other elements can be easily carried out by photetching, and also a method of manufacturing the semiconductor device.

In order to accomplish this object, the invention provides a recess in the substrate and affixes at least one element therein, to thus reduce stepped parts among the silicon scanning elements, the other elements and the substrate, and further deposits conductors onto an insulating layer deposited commonly on the substrate and the elements and uses them as writings, to thus easily establish good interconnections.

BRIEF DESCRIPTION OF THE DRAWINGS

FIG. 1 is a view for explaining the principle of a solid state imaging device which employs photoelectric transducers and silicon scanning elements, FIGS. 4(a)-4(g) and FIG. 5 are process diagrams showing another embodiment of the invention and a plan view of a semiconductor device formed by the process, respectively, FIGS. 6(a)-6(h) and FIG. 7 illustrate still another embodiment of the invention, and FIG. 8 is a sectional view showing the structure of a semiconductor device of yet another embodiment of the invention.

DETAILED DESCRIPTION

Embodiment 1

This emobidment is directed to a semiconductor device in which the interconnections between scanning elements and other elements formed in a substrate can be formed by photoetching, and a method of manufacturing the semiconductor device.

Figure 2A:
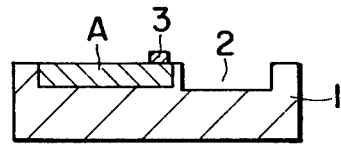
FIGS. 2(a)-2(e) and FIG. 3 are process diagrams showing an embodiment of the invention and a plan view of a semiconductor device formed by the process, respectively.

FIGS. 2(a) to 2(e) illustrate steps for forming such a device. First, as shown in FIG. 2(a), on and in the surface of a silicon substrate 1 in which a scanning circuit element A for drive is formed, connecting terminals 3 of the circuit element A and a recess 2 are respectively formed.

Figure 2B:
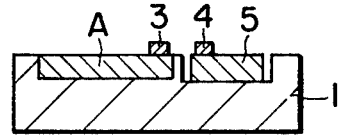
Figure 2C:
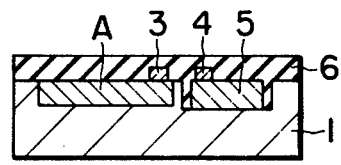

As shown in FIG. 2(b), a GaAs$_{1-x}$P$_x$ chip 5 equipped with connecting terminal 4 is placed in the recess 2. Subsequently, as shown in FIG. 2(c), a silicon oxide coating material (which forms a film of silicon dioxide when applied and let stand at room temperature) is applied, to form a silicon dioxide film 6 which is about 1 μm thick. When, at this step, the silicon oxide coating material is used as described above, it is preferable that the chip 5 be fixed within the recess 2 in advance by the use of, for example, an epoxy resin. As the material of the insulating film, a resin such as a polyimide resin and an epoxy resin can be employed instead of the silicon coating material. Since, in this case, the chip 5 is fixed to the substrate 1 by the resin, it need not be fixed within the recess 2 in advance and may be merely placed therein.

By performing a heat treatment at 150° C. for thirty minutes, the silicon dioxide film 6 is hardened.

Figure 2D:
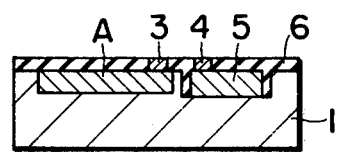

The silicon dioxide film 6 is gradually etched from the surface by plasma etching, to expose the surfaces of the connecting terminals 3 and 4 as shown in FIG. 2(d). Thus, as is apparent from FIG. 2(d), the step or level difference between the connecting terminals 3 and 4 is eliminated, and the interspace between both the connecting terminals is filled with the silicon dioxide film 6, so that the portion between the connecting terminals 3 and 4 becomes flat.

Figure 2E:
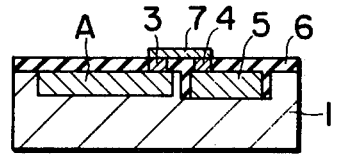

After an aluminum film having a thickness of about 1 μm is deposited on the entire area by conventional vacuum evaporation, unnecessary parts thereof are removed by photoetching. Then, as shown in FIG. 2(e), both the connecting terminals 3 and 4 are electrically connected by an aluminum wiring 7. Since, as stated above, the portion between the connecting terminals 3 and the connecting terminals 4 is flat and has neither any step nor any clearance, the aluminum wirings 7 are extraordinarily good.

Figure 3:
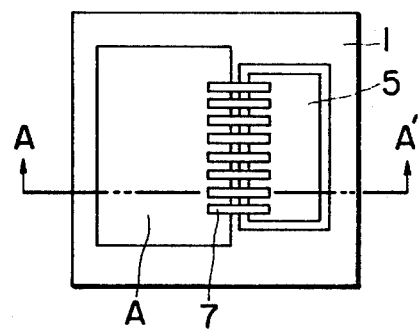

FIG. 3 is a plan view of the semiconductor device formed in this way, and FIG. 2(e) is a sectional view taken along A–A′ in FIG. 3.

By fixing the photoelectric transducers within the recess formed in the substrate and providing the insulating layer common to the substrate and the photoelectric transducers as illustrated in FIG. 2(e) and FIG. 3, the flat wirings having no step or no level difference can be provided very easily. Although, in this embodiment, the light emitting elements of GaAs$_{1-x}$P$_x$ are employed, it is needless to say that other light emitting elements of, for example, GaP can be used quite similarly. According to the invention, the electrical connections between several hundred of light emitting elements and the scanning silicon element can be reliably performed by a small number of steps of manufacture.

Embodiment 2

FIGS. 4(a) to 4(g) are views showing the steps of manufacture in which a one-dimentional scanning light receptor array is formed by performing the interconnections between an Se-As-Te system amorphous semiconductor light receptor array and a silicon element for scanning. Although, in this embodiment, Se-As-Te is employed as the material of the amorphous semiconductor light receptor array, a light receptor array made of any other amorphous semiconductor such as Se-Ge-Te, As$_2$Se$_3$ and amorphous silicon can be treated quite similarly. In particular, an amorphous semiconductor containing at least 50 atomic-% of Se is useful for a light receptor for visible light.

As shown in FIGS. 4(a) and 4(b), a ceramic substrate 8 is provided with a recess 9, in which a silicon chip 11 having connecting terminals 10 and a scanning circuit (not shown) is fixed.

Subsequently, as shown in FIG. 4(c), a polyimide resin is applied over the entire area, to form a resin film 12 having a thickness of about 3 μm.

The resin film 12 is hardened by heating the resultant structure at 170° C. for one hour. Thereafter, the resin film 12 is gradually etched from the surface by plasma etching with oxygen gas, to expose the surface of the terminal 10 as shown in FIG. 4(d).

As shown in FIG. 4(e), stripe aluminum electrodes 13 are formed by depositing an aluminum film about 1 μm thick by the vacuum evaporation and subsequently removing unnecessary parts by photoetching.

As shown in FIGS. 4(f) and 4(g), an Se-As-Te photoconductor film 14 being about 2 μm thick is formed on the stripe aluminum electrodes 13 by the mask evaporation, and further, aluminum electrodes 15 having a slit of small width therebetween are formed thereon by the mask evaporation.

FIG. 5 is a plan view of the one-dimentional scanning light receptor array formed by such process, and FIG. 4(g) is a sectional view taken along A–A′ in FIG. 5. An input light signal enters the photoconductor film 14 through the slit between the two aluminum electrodes 15. As is apparent from FIG. 5, the one-dimentional scanning light receptor array of this embodiment can have the length of the Se-As-Te photoconductor film 14 increased without being limited by the size of the scanning silicon element chip. It is therefore useful as a light receptor which is employed for the input of a facsimile, an electronic copying machine, or the like. It is also possible to assemble a plurality of scanning silicon element chips.

Embodiment 3

FIGS. 6(a) to 6(h) are sectional views showing the process of manufacturing a light receptor array employing CdSe, and FIG. 7 is a plan view of the light receptor array formed by the process.

Figure 6A:
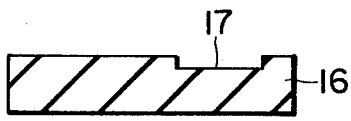
Figure 6B:
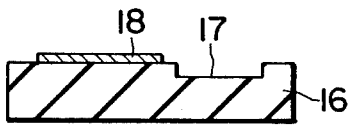
Figure 6C:
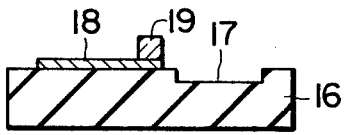

First, as is shown in FIG. 6(a), a recess 17 is formed in a hard glass substrate 16. Subsequently, as is shown in FIGS. 6(b) and 6(c), transparent conductive films (nesa films) 18 in the shape of stripes are deposited, whereupon a connecting Cr-Au terminal 19 is formed at one end of each transparent conductive film.

Figure 6D:
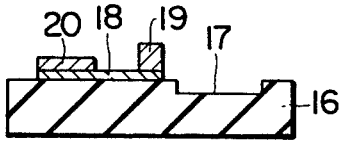

By maintaining the substrate temperature at 150° C., a CdSe photoconductive film 20 is deposited in a vacuum of $3 \times 10^{-6}$ Torr by mask evaporation, as shown in FIG. 6(d).

A heat treatment at 350° C. for one hour is carried out in an oxygen atmosphere of 1 atm., to promote the recrystallization of the CdSe film 20 and to enhance the photosensitivity thereof.

Figure 6E:
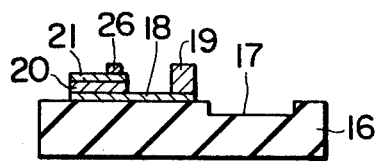

After returning the substrate to room temperature, as is shown in FIG. 6(e), an aluminum electrode 21 is deposited on the CdSe film 20 by mask evaporation, and further, a connecting terminal 26 is formed thereon.

Figure 6F:
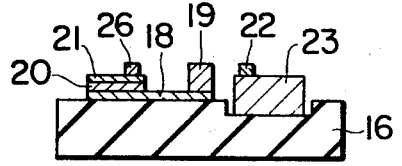
Figure 6G:
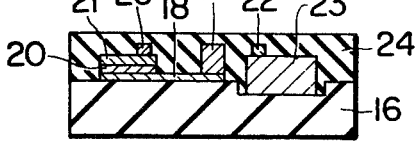

As is shown in FIG. 6(f), a silicon chip 23 having connecting terminals 22 and a scanning circuit (not shown) is fixed in the recess 17 of the substrate 16. Further, as is shown in FIG. 6(g), an epoxy resin film 24 is deposited over the entire area. While the resin film 24 is deposited as an insulating film, it also functions as a protective film for the Cd Se photoconductive film 20.

Figure 6H:
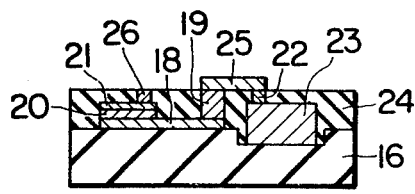

After hardening the epoxy resin film 24 by heating the entire substrate at 100° C. for one hour, the epoxy resin film 24 is gradually etched from the surface by plasma etching with argon, to expose both the connecting terminals 19 and 22. Subsequently, as is shown in FIG. 6(h), both the terminals 19 and 22 are connected by an aluminum film 25 being 1 μm thick by the conventional vacuum evaporation-photoetching process. Then, the CdSe photoconductive film 20 and the scanning silicon chip 23 are electrically connected through the transparent electrodes 18. The connecting terminal 26 is a terminal for deriving signals, and it is used for deriving currents corresponding to light incident on the Cd Se photoconductive film 20 through the transparent electrodes 18.

Although FIG. 7 illustrates the case of the single scanning silicon chip 23, it is a matter of course that a plurality of silicon chips may be similarly fixed to the substrate 16 without being necessarily restricted to the single silicon chip 23.

Although this embodiment employs Cd-Se as the photoelectric transducer material, it is needless to say that good interconnections can be similarly effected even when an element of a photoelectric transducer material other than Cd-Se, such as group II-group VI compound and group III-group V compound, is used.

Embodiment 4

In any of Embodiments 1 through 3, only one of the elements having different functions is placed in the recess provided in the substrate, and the other element is placed on the substrate or formed within the substrate by diffusion etc.

This invention, however, can also form a device wherein not only the one element, but also the other element is placed in the recess provided in the substrate.

FIG. 8 is a partial sectional view showing such an embodiment. The embodiment is a semiconductor device in which a $GaAs_{1-x}P_x$ light emitting element array 28 and a driving silicon element 29 are respectively placed in recesses 32 and 33 provided in a glass substrate 27, and which can be formed by the same method as described in Embodiment 1.

Both the light emitting element array 28 and the silicon element 29 have thicknesses of 100 to 200 μm. On the other hand, in order to form a good interconnection, the step or level difference between a terminal 30 of the element 28 and a terminal 31 of the element 29 must be 10 μm at a maximum, desirably at most 1 μm. It is obvious that no good wiring can be formed when both elements 28 and 29 having such thicknesses are arranged on the substrate 27. According to the invention, however, as seen from FIGS. 2(a) through 2(e), FIGS. 4(a) through 4(g), FIGS. 6(a) through 6(h) and FIG. 8, the steps or level differences between the terminals of both the elements are eliminated by the recess, and the interspace between both the terminals is filled with the insulating layer. Therefore, the portion between both the terminals is very flat, and electrical connections by good aluminum wirings can be easily formed by conventional processes.

As set forth above, according to the invention, a light receiving or emitting element in the shape of a long stripe or a large number of light receiving or emitting elements in an array can be electrically connected with a silicon scanning element very easily. The interconnections between the elements have hitherto required very much labor and a long period of time on account of the number of steps and clearances, whereas according to the invention, the interconnections are extraordinarily facilitated as stated above. Therefore, the invention is very useful for the manufacture of, for example, a solid state imaging device and can form a very excellent device.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:
1. A semiconductor device comprising:
    a substrate containing at least two semiconductor elements made of semiconductor materials different from each other, one of said elements being disposed and fixed in a first recess provided in said substrate by a hardened fluid material, and the other element being disposed in a second recess provided in said substrate, wherein said one element is finished semiconductor chip made of a material different from that of the substrate;
    an insulating film disposed on said substrate and said elements and having apertures extending therethrough exposing surface portions of said elements wherein the top surface of the insulating film provides a flat surface free of steps between the apertures; and
    conductive material disposed on said insulating film and extending through said apertures so as to be in contact with both of said elements so that the conductive material forms a flat connection free of any steps over the insulating film between said elements.

2. A semiconductor device according to claim 1, wherein a first of said elements is made of silicon.

3. A semiconductor device according to claim 2, wherein a second of said elements is made of a material selected from the group consisting of a group II-group VI compound and a group III-group V compound.

4. A semiconductor device according to claim 2, wherein a second of said elements is made of an amorphous semiconductor.

5. A semiconductor device according to claim 4, wherein said amorphous semiconductor is made of at least one material selected from the group consisting of Se-As-Te, Se-Ge-Te, amorphous silicon, and $As_2Se_3$.

6. A semiconductor device according to claim 1, wherein said substrate is made of silicon.

7. A semiconductor device according to claim 6, wherein said one element is made of a material selected from the group consisting of a group II-group VI compound and a group III-group V compound, and another of said elements is made of silicon and is formed within said substrate.

8. A semiconductor device according to claim 1, wherein said substrate is made of a material selected from the group consisting of glass and a ceramic.

9. A semiconductor device according to claim 1, wherein another of said elements is disposed on the surface of said substrate.

10. A semiconductor device according to claim 9, wherein said one element is made of silicon and said another element is made of at least one material selected from the group consisting of a group II–group VI compound, a group III–group V compound, and an amorphous semiconductor.

11. A semiconductor device according to claim 1, wherein another of said elements is disposed in a second recess provided in said substrate.

12. A semiconductor device according to claim 1, wherein another of said elements comprises a scanning circuit element, said one element comprises a photoelectric element.

13. A semiconductor device according to claim 12, wherein a plurality of said photoelectric elements are disposed in said recess, and wherein said conductive material is provided as a plurality of parallel, spaced-apart conductor layers interconnecting said photoelectric elements with said scanning element.

14. A semiconductor device according to claim 13, wherein said photoelectric elements are light emitting elements.

15. A semiconductor device according to claim 9, wherein said another element comprises a layer of photoconductive material disposed upon said conductive material and extending in a direction transverse to that of said conductive material, and a plurality of spaced apart stripe electrodes disposed on said layer of photoconductive material, so that said another element forms a photodetector.

16. A semiconductor device according to claim 9, wherein said another element comprises a layer of photoresponsive material disposed upon a conductive film formed on said substrate, said conductive material extending through an aperture in said insulating film so as to be in contact with the conductive film of said another element.

17. A semiconductor device according to claim 1, wherein the insulating film extends into the recess surrounding the sides of the semiconductor element in said recess.

18. A semiconductor device according to claim 1, wherein the first semiconductor element is bonded in the recess by an epoxy resin.

19. a semiconductor device according to claim 1, wherein the insulating film is a hardened insulation material which serves to both fix the first semiconductor element in the first recess and to form the insulating film.

20. A semiconductor device comprising:
a substrate containing at least two semiconductor elements made of semiconductor materials different from each other, one of said elements being disposed and fixed in a first recess provided in said substrate by a hardened fluid material, and the other element being disposed on the surface of the substrate, wherein said one element is a finished semiconductor chip made of a material different from that of the substrate;
an insulating film disposed on said substrate and said elements and having apertures extending therethrough exposing surface portions of said elements wherein the top surface of the insulating film provides a flat surface free of steps between the apertures; and
conductive material disposed on said insulating film and extending through said apertures so as to be in contact with both of said elements to that the conductive material forms a flat connection free of any steps over the insulating film between said elements.

21. A semiconductor device according to claim 20, wherein the first semiconductor element is bonded in the recess by an epoxy resin.

22. A semiconductor device according to claim 20, wherein the insulating film is a hardened insulation material which serves to both fix the first semiconductor element in the first recess and to form the insulating film.

* * * * *